United States Patent
Yang et al.

(10) Patent No.: US 8,253,178 B1
(45) Date of Patent: Aug. 28, 2012

(54) CMOS IMAGE SENSOR WITH PERIPHERAL TRENCH CAPACITOR

(75) Inventors: Rongsheng Yang, San Jose, CA (US); Zhiqiang Lin, Santa Clara, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 13/196,689

(22) Filed: Aug. 2, 2011

(51) Int. Cl.
*H01L 31/062* (2012.01)
*H01L 31/113* (2006.01)
*H01L 31/00* (2006.01)
*H01L 29/735* (2006.01)
*H01L 31/0328* (2006.01)
*H01L 31/0336* (2006.01)
*H01L 31/072* (2012.01)
*H01L 31/109* (2006.01)
*H01L 29/04* (2006.01)
*H01L 29/10* (2006.01)
*H01L 31/036* (2006.01)
*H01L 31/0376* (2006.01)
*H01L 31/20* (2006.01)
*H01L 29/76* (2006.01)
*H01L 31/112* (2006.01)
*H01L 29/15* (2006.01)

(52) U.S. Cl. ............. 257/291; 257/57; 257/59; 257/66; 257/69; 257/72; 257/187; 257/292; 257/293; 257/443; 257/444; 257/446; 257/E27.062; 257/E29.092; 257/E27.108; 257/E27.132; 257/E27.133; 257/E27.141

(58) Field of Classification Search .................. 257/57, 257/59, 66, 69, 72, 187, 291, 292, 293, 443, 257/444, 446, E27.062, E27.092, E27.108, 257/E27.132, E27.133, E27.141
See application file for complete search history.

(56) References Cited

U.S. PATENT DOCUMENTS

| | | | |
|---|---|---|---|
| 7,193,262 B2 | 3/2007 | Ho et al. | |
| 7,432,148 B2 * | 10/2008 | Li et al. | 438/218 |
| 7,518,143 B2 * | 4/2009 | Sugawa | 257/59 |
| 7,518,172 B2 * | 4/2009 | Moon et al. | 257/292 |
| 7,755,119 B2 * | 7/2010 | Rhodes | 257/292 |
| 7,772,627 B2 * | 8/2010 | Hong | 257/292 |
| 7,948,018 B2 * | 5/2011 | Venezia et al. | 257/294 |
| 7,968,923 B2 * | 6/2011 | Nagaraja et al. | 257/294 |
| 8,101,978 B2 * | 1/2012 | Dai et al. | 257/228 |
| 2007/0023801 A1 * | 2/2007 | Hynecek | 257/292 |
| 2010/0308385 A1 * | 12/2010 | Manda et al. | 257/292 |
| 2012/0080765 A1 * | 4/2012 | Ku et al. | 257/432 |

OTHER PUBLICATIONS

Black et al., "High-Capacity, Self-Assembled Metal-Oxide-Semiconductor Decoupling Capacitors," IEEE Electron Device Letters, vol. 25, No. 9, Sep. 2004, pp. 622-624 (3 pages).

* cited by examiner

*Primary Examiner* — Ida M Soward
(74) *Attorney, Agent, or Firm* — Blakely Sokoloff Taylor & Zafman LLP

(57) ABSTRACT

An example complementary metal oxide semiconductor (CMOS) image sensor includes an epitaxial layer, an array of pixels, and a trench capacitor. The array of pixels are formed on a front side of the epitaxial layer in an pixel array area of the image sensor. The array of pixels includes one or more shallow trench isolation structures disposed between adjacent pixels for isolating the pixels in the pixel array area. The trench capacitor is formed on the front side of the epitaxial layer in a peripheral circuitry area of the image sensor.

8 Claims, 7 Drawing Sheets

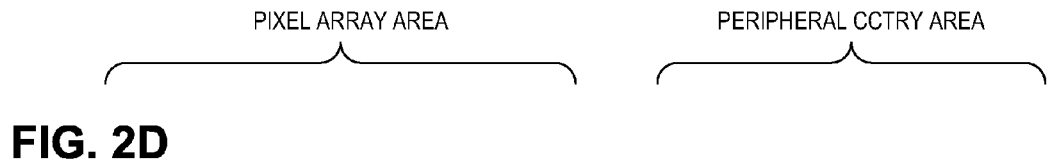
FIG. 2D
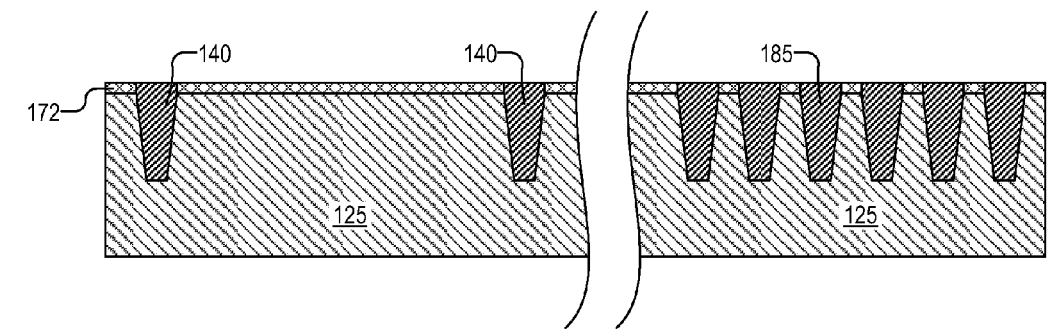
FIG. 2E
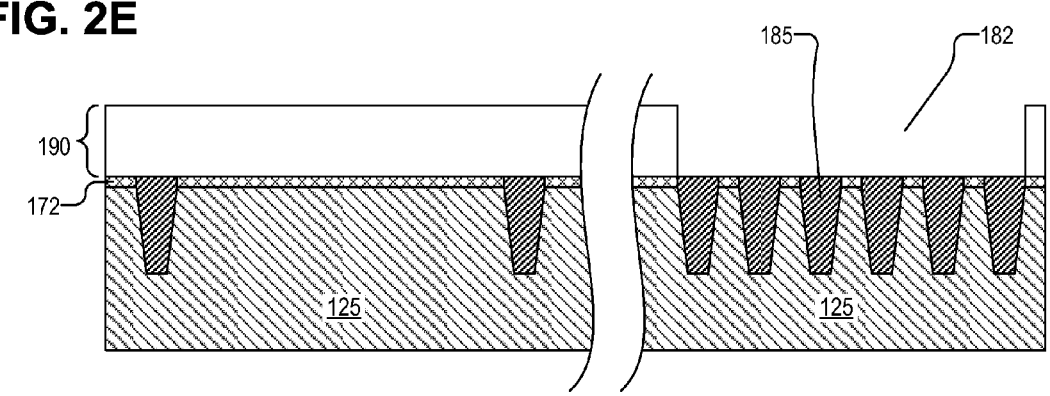
FIG. 2F
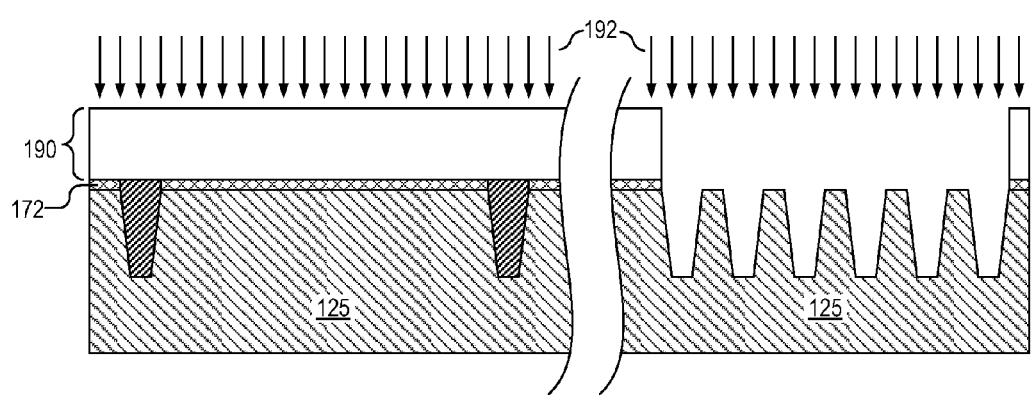

PIXEL ARRAY AREA    PERIPHERAL CCTRY AREA

PLAN VIEW

SECTION A-A

SECTION B-B

PLAN VIEW

SECTION A-A

CMOS IMAGE SENSOR WITH PERIPHERAL TRENCH CAPACITOR

TECHNICAL FIELD

This disclosure relates generally to image sensors, and in particular but not exclusively, relates CMOS imaging sensors with peripheral capacitors.

BACKGROUND INFORMATION

Image sensors have become ubiquitous. They are widely used in digital still cameras, cellular phones, security cameras, medical devices, automobiles, and other applications. The technology used to manufacture image sensors, and in particular complementary metal-oxide semiconductor ("CMOS") image sensor ("CIS"), has continued to advance at a great pace. Modern image sensor applications place demands for faster processing speeds and better image quality, while simultaneously expecting miniaturization in the physical size of the image sensor. So new architectures need to be developed to improve the performance while maintaining or reducing the size of the image sensor circuits to keep pace with these demands.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIGS. 2A-2I illustrate a process of fabricating a CMOS image sensor, in accordance with an embodiment of the invention.

DETAILED DESCRIPTION

Embodiments of a CMOS image sensor with a peripheral trench capacitor are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. Directional terminology such as "top", "down", "above", "below" are used with reference to the orientation of the figure(s) being described.

Figure 1:
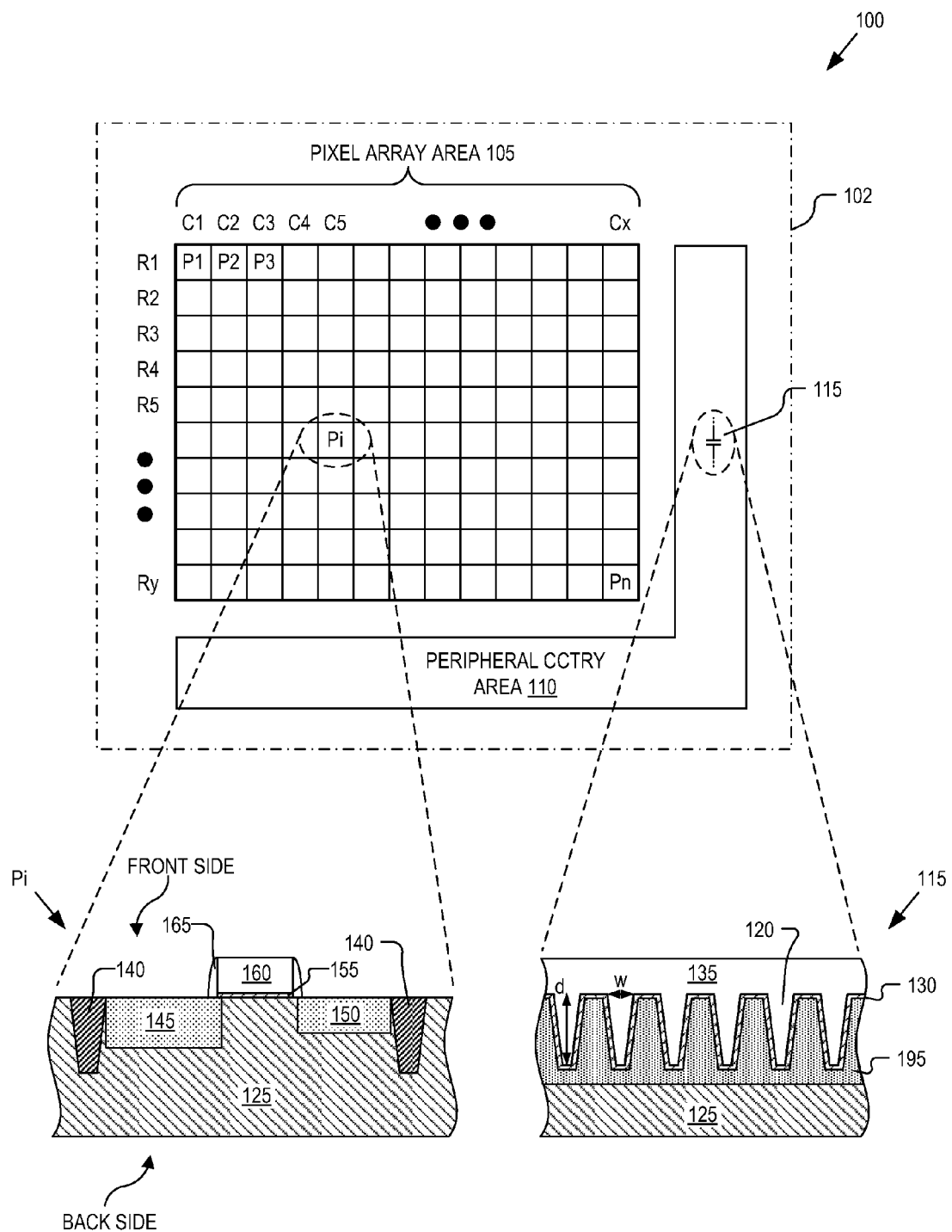
FIG. 1 is a functional block diagram and cross-sectional view of a CMOS image sensor, in accordance with an embodiment of the invention.

FIG. 1 is a functional block diagram and cross-sectional view of a CMOS image sensor 100 having a peripheral trench capacitor 115, in accordance with an embodiment of the invention. The illustrated embodiment of CMOS image sensor 100 includes a pixel array area 105 and a peripheral circuitry area 110. In one example, peripheral circuitry area 110 includes circuitry that is not physically located within the pixel array area 105 and, instead, borders a periphery of the semiconductor die 102, on which, CMOS image sensor 100 is fabricated.

Pixel array area 105 includes a two-dimensional ("2D") array of imaging pixels (e.g., pixels P1, P2 . . . , Pn). As illustrated, each pixel is arranged into a row (e.g., rows R1 to Ry) and a column (e.g., column C1 to Cx) to acquire image data of a person, place, or object, which can then be used to render a 2D image of the person, place, or object.

Shown towards the bottom of FIG. 1, is a cross-sectional view of an example imaging pixel Pi that is included in pixel array area 105. The illustrated embodiment of imaging pixel Pi includes an epitaxial ("EPI") layer 125, shallow trench isolation ("STI") structures 140, photodiode region 145, a floating diffusion 150, and gate oxide 155, transfer gate electrode 160, and sidewall spacers 165.

In the illustrated embodiment of FIG. 1, epi layer 125 is a layer of silicon that is epitaxially grown on a silicon substrate (not shown). In one example, the silicon substrate on which epi layer 125 is grown may be p+ type doped silicon, while epi layer 125, itself, is doped at an intermediate level of p type doping.

Also included in imaging pixel Pi is transfer gate electrode 160 which is coupled to transfer charge that is accumulated in photodiode region 145 to floating diffusion 150. In one embodiment, transfer gate electrode 160 is a polycrystalline silicon (i.e., polysilicon) structure. Gate oxide 155 is disposed between the transfer gate electrode 160 and the front side of epi layer 125 to isolate the transfer gate electrode 160 from the surface of epi layer 125.

During operation, incident light is received by imaging pixel Pi. Electron-hole pairs are generated in response to the received light. The electrons are then collected in photodiode region 145, transferred to floating diffusion 150 by way of transfer gate electrode 160, and converted into electrical signals to be received, processed, and stored by circuitry located in peripheral circuitry area 110.

As shown, STI structures 140 are disposed in epi layer 125 between imaging pixel Pi and adjacent imaging pixels to isolate the adjacent imaging pixels. For example, STI structures 140 may be configured to act as a barrier to keep charge carriers (e.g., photo-generated electrons) from diffusing into an adjacent imaging pixel.

The illustrated example of peripheral circuitry area 110 may include control circuitry coupled to the pixel array to control operational characteristics of the pixel array. For example, the control circuitry may generate a shutter signal for controlling image acquisition. After each pixel has acquired its image data or image charge, the image data is readout from the floating diffusion 150 by readout circuitry included in peripheral circuitry area 110. The readout circuitry may include sampling circuitry, amplification circuitry, or otherwise. The readout circuitry then transfers the image data to function logic, also included in peripheral circuitry area 110, to store the image data or even manipulates the image data by applying post image effects (e.g., crop, rotate, remove red eye, adjust brightness, adjust contrast, or otherwise). In one embodiment, the readout circuitry may readout a row of image data at a time along readout column lines (illustrated) or may readout the image data using a variety of other techniques (not illustrated).

Circuitry included in peripheral circuitry area 110 typically requires one or more large-value capacitors for proper operation. For example, a sampling circuit included in the readout circuitry may include a large-value capacitor for sampling image data acquired with the imaging pixels. For these large-value capacitors, conventional CMOS image sensors typically include a capacitor of a planar structure. That is, a conventional planar-structured capacitor includes a planar layer of dielectric disposed between two planar layers of semiconductor material that each serve as a respective electrode/plate of the capacitor. However, a planar-structured capacitor occupies a relatively large area of the semiconductor die and may be difficult, if not impossible to scale. Thus, use of a planar-structured capacitor in the peripheral circuitry area of the conventional CMOS image sensor limits the scalability of the semiconductor die.

Accordingly, embodiments of the present invention include a trench capacitor 115 that reduces the physical area needed for large-value capacitors in peripheral circuitry area 110. Alternatively, or in addition, trench capacitor 115 may provide increased capacitance, while maintaining or reducing the required area for the capacitor in peripheral circuitry area 110.

The bottom of FIG. 1 illustrates a cross-sectional view of example trench capacitor 115 that is included in peripheral circuitry area 110. The illustrated example of trench capacitor 115 includes one or more trenches 120, dielectric layer 130, polysilicon layer 135, and a doped portion 195 of epi layer 125. Thus, in the illustrated embodiment, dielectric layer 130 serves as the dielectric, polysilicon layer 135 serves as a top electrode/plate, and doped portion 195 of epi layer 125 serves as a bottom electrode/plate of trench capacitor 115.

By using a trench structure for capacitor 115, it's capacitance for a set area of semiconductor die 102 is increased when compared to a planar-structured capacitor. For example, assuming trench 120 has an approximate width w of 0.1 microns, a depth d of 0.3 microns, and a spacing of 0.1 microns, the area occupied by capacitor 115 is decreased by around 4× when compared to a planar-structured capacitor of the same capacitance. In other words, trench capacitor 115 may only need around one-fourth of the area used for a planar-structured capacitor. Therefore, in one embodiment, assuming planar-structured capacitors occupy 20% of the total size of a semiconductor die, then by using trench capacitors, such as trench capacitor 115, a 15% reduction in the total size of the semiconductor die 102 can be realized.

Figure 2A:
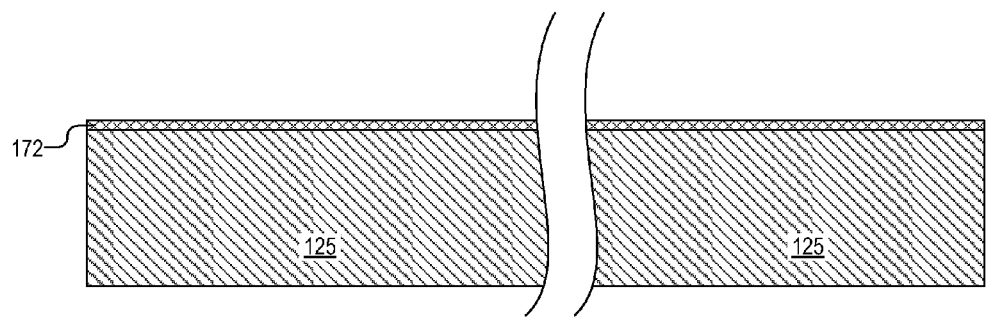
Figure 2B:
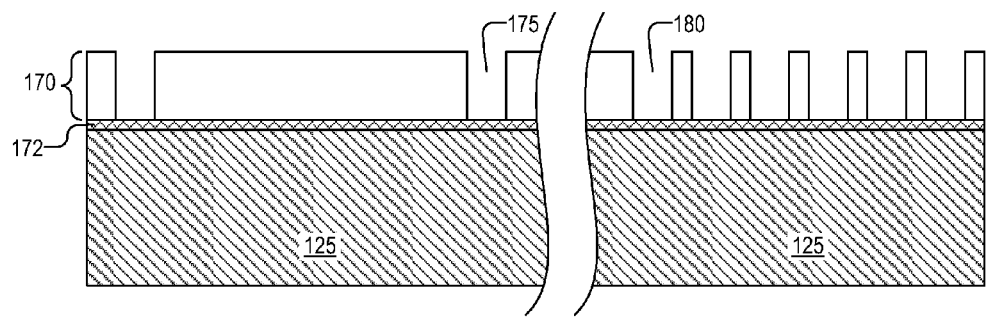

FIGS. 2A-2I illustrate a process of fabricating CMOS image sensor 100, in accordance with an embodiment of the invention. In FIG. 2A, epi layer 125 having pixel array area and peripheral circuitry area is provided. Next, an oxide layer 172 is grown on the front side of epi layer 125. In one embodiment, a nitride layer (not shown) is deposited over oxide layer 172. As shown in FIG. 2B, a mask 170 is then formed on the surface of oxide layer 172 on the front side of epi layer 125. Mask 170 is formed to include at least one opening 175 in the pixel array area for forming a trench for the STI structures (e.g., STI 140) and also at least one opening 180 in the peripheral circuitry area for forming a trench for the trench capacitor (e.g., trench capacitor 115). In one embodiment, mask 170 is a conventional STI mask used for forming STI structures, where the STI mask has been modified to include additional openings in the peripheral circuitry area for forming the trench capacitors.

Figure 2C:
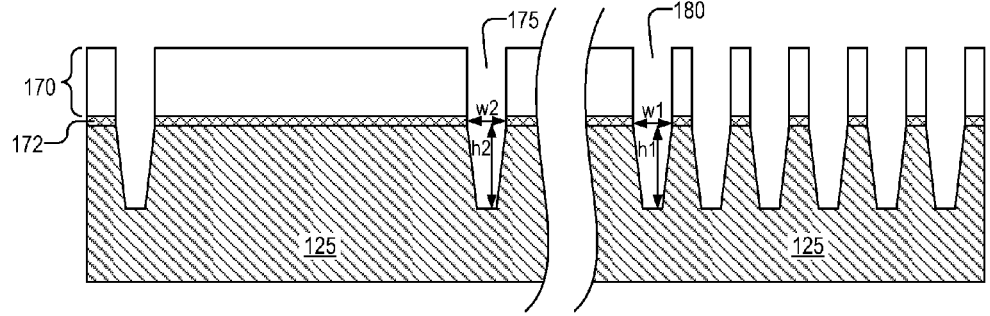

Epi layer 125 and oxide layer 172 are then etched through openings 175 and 180 to form trenches in both the pixel array area and the peripheral circuitry area. Thus, in one embodiment, etching the epi layer 125 includes simultaneously etching trenches in the pixel array area and peripheral circuitry area for the STI structures and trench capacitors, respectively. FIG. 2C illustrates the resultant trenches formed in epi layer 125 after etching. As shown in FIG. 2C, the trench in the peripheral circuitry area for the trench capacitor has a height h1 and width w1, that is substantially equal to the height h2 and width w2, respectively of the trench formed in the pixel array area for the STI structure.

Next, the normal process flow for a CMOS image sensor is resumed, including the formation of STI structures 140. For example, after mask 170 is removed, an oxide (not shown) may be thermally grown over the entire image sensor 100 and an oxide 185 may then be deposited, by a process, such as chemical vapor deposition (CVD). The deposited oxide 185 may fill the trenches in both the peripheral circuitry area and in the pixel array area and may even extend above the top surface of epi layer 125. Thus, the formation process may include an additional stage of planarizing the top surface by chemical mechanical polishing (CMP) the deposited oxide 185 down to oxide layer 172, leaving the trenches filled, as shown in FIG. 2D.

Figure 2G:
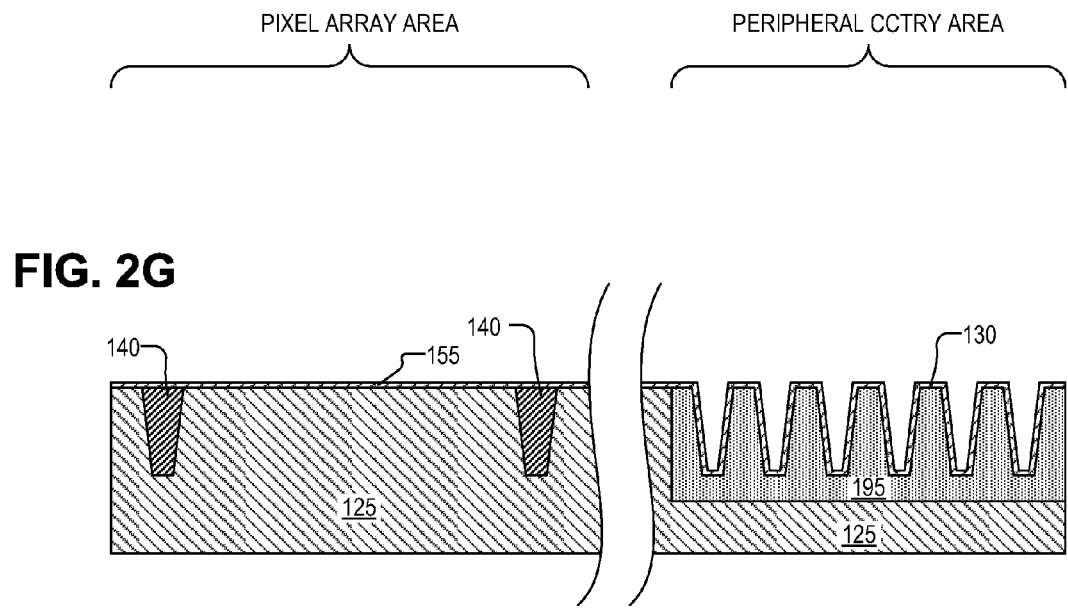

Prior to the formation of the gate oxide 155, a mask 190 is formed on epi layer 125, as shown in FIG. 2E. Mask 190 covers the STI structures 140 and also includes one or more openings 182 aligned with the trenches formed in the peripheral circuitry area so that oxide 185 can be removed from the trenches with a wet or dry etch. After oxide layer 172 and oxide 185 are removed from opening 182, an optional implant of dopant 192, as shown in FIG. 2F, may be performed to form a doped portion 195 that serves as a bottom electrode of the trench capacitor 115. FIG. 2G then illustrates removal of mask 190, removal of remaining oxide layer 172, and the growing of oxide 130 on doped portion 195 to serve as the dielectric of the trench capacitor 115. In one embodiment, a nitride layer (not shown) is deposited over oxide layer 130. Gate oxide 155 is also grown on epi layer 125 in the pixel array area to be used to isolate transfer gate 160 from the surface of epi layer 125. In one embodiment, gate oxide 155 is formed from the same oxide as oxide 130 of the trench capacitor 115. In other words, oxide 130 and gate oxide 155 may be formed at the same time with the same process step.

In other process embodiments, gate oxide 155 and oxide 130 are grown separately. For example, after removal of mask 190, oxide layer 172 may be removed only from the peripheral circuitry area and kept in the pixel array area, such that oxide layer 130 is grown in the peripheral circuitry area and masked/removed from the pixel array area. Subsequently, when gate oxide 155 is grown in the pixel array area, oxide 130 in the peripheral circuitry may become thicker by however much the gate oxide process adds. Thus, in this embodiment oxide 130 for the trench capacitor 115 may be thicker than the gate oxide 155.

Figure 2H:
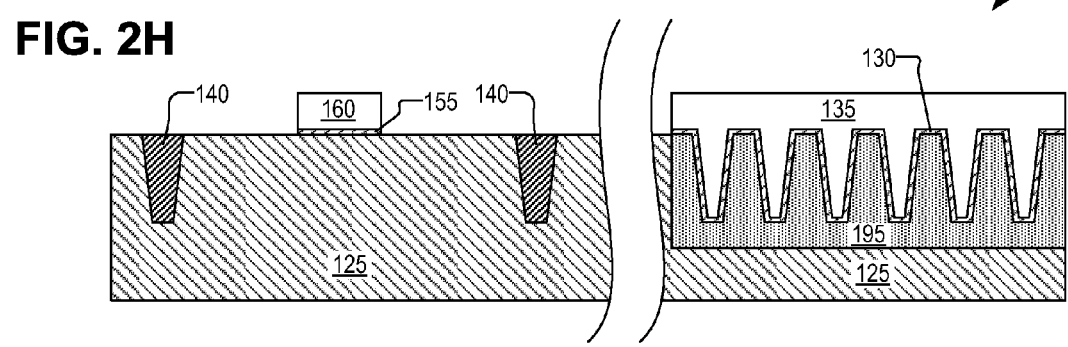
Figure 2I:
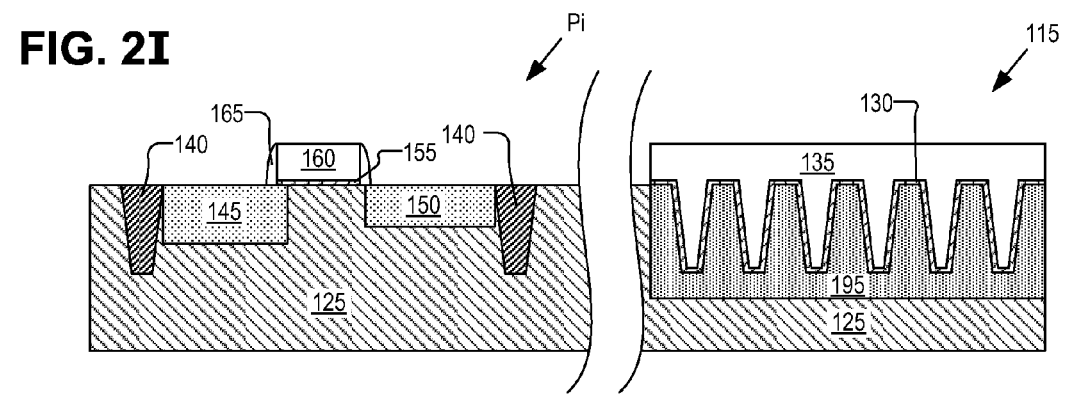

Next, as shown in FIG. 2H, a polysilicon layer 135 is deposited on oxide layer 130. In this embodiment, polysilicon layer 135 serves as a top electrode of trench capacitor 115. Also formed at this time, is transfer gate electrode 160. In one embodiment, transfer gate electrode 160 is a polysilicon gate electrode, and may be the same polysilicon that is deposited to form polysilicon layer 135. Thus, in one embodiment, transfer gate 160 and polysilicon layer 135 are formed at the same time with the same process step. In other embodiments, transfer gate electrode 160 and polysilicon layer 135 are formed separately. Next, the normal process flow for a CMOS image sensor is resumed, once again, including the formation of photodiode region 145, floating diffusion 150 and sidewall spacers 165, as well as the remaining components of CMOS image sensor 100.

Figure 3:
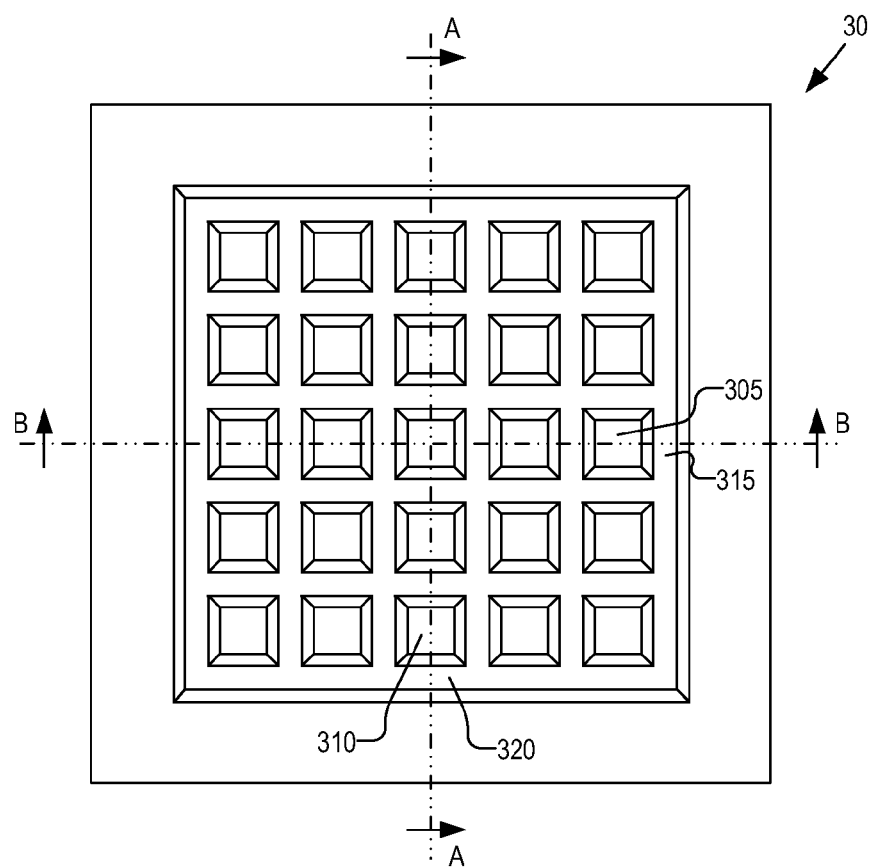
FIG. 3 is a plan view and sectional views of a bottom electrode of a trench capacitor for use in a CMOS image sensor, in accordance with an embodiment of the invention
Figure 3:
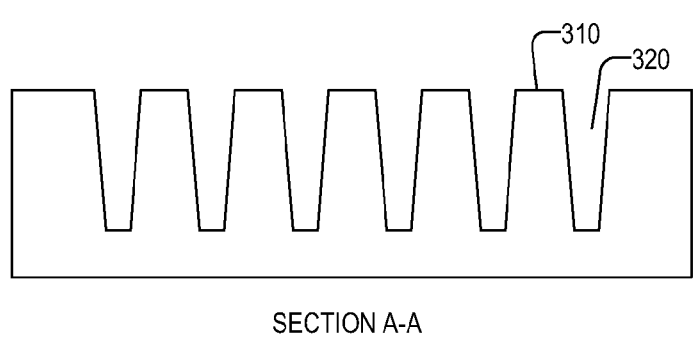
Figure 3:
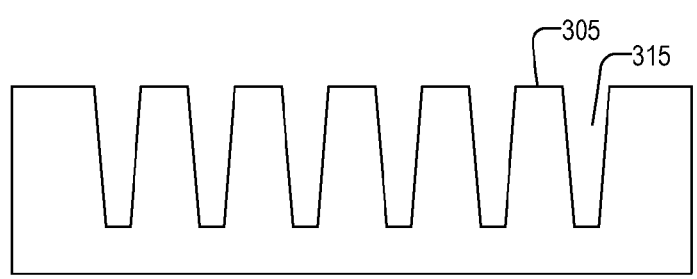

FIG. 3 is a plan view and sectional views of a bottom electrode 300 of a trench capacitor for use in a CMOS image sensor, in accordance with an embodiment of the invention. Bottom electrode 300 is one possible implementation of the bottom electrode (i.e., doped portion 195) of trench capacitor 115 of FIG. 1. As can be seen from FIG. 3, bottom electrode has a waffle structure having a plurality of posts 305 and 310, and a plurality of trenches 315 and 320. The waffle structure of bottom electrode 300 may be formed through the patterning of openings 180 in mask 170 of FIGS. 2A and 2B.

Figure 4:
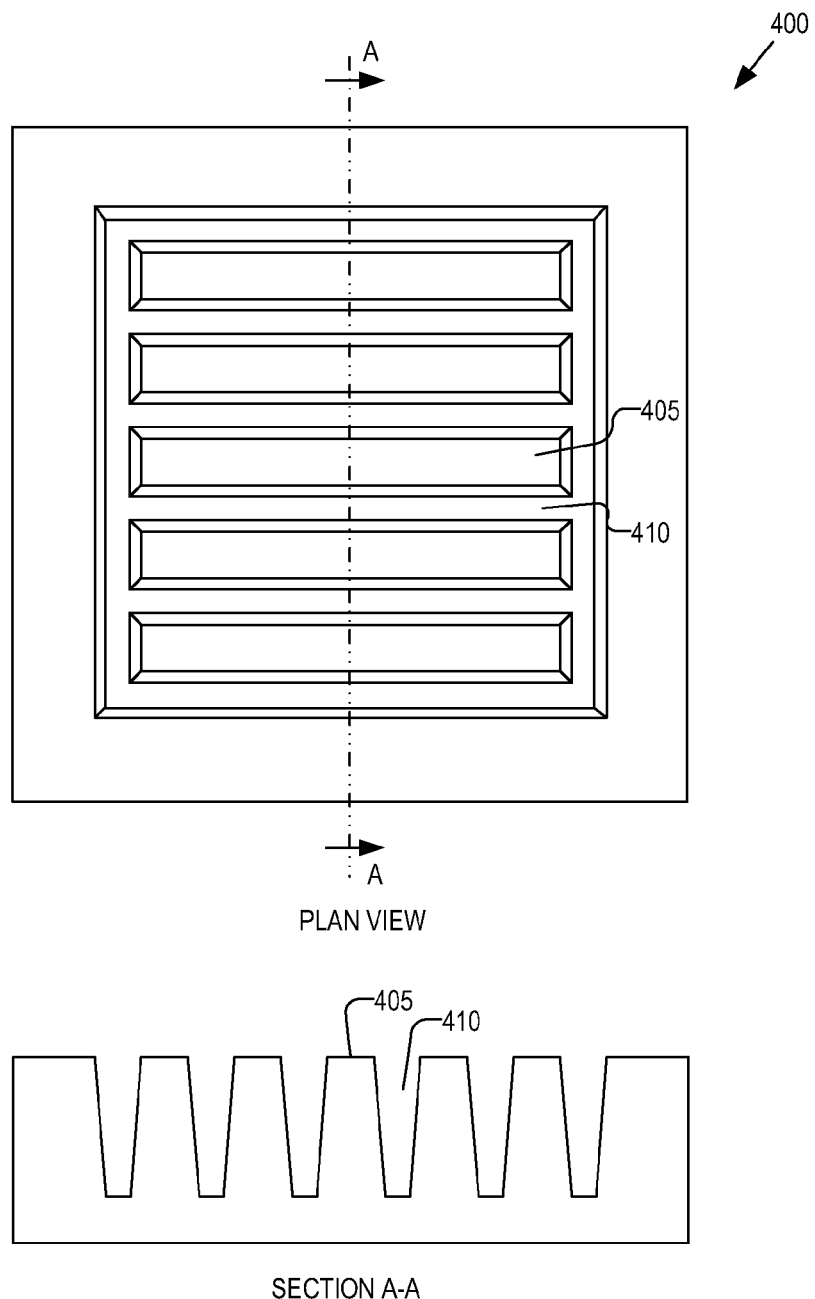
FIG. 4 is a plan view and a sectional view of a bottom electrode of a trench capacitor for use in a CMOS image sensor, in accordance with another embodiment of the invention.

FIG. 4 is a plan view and a sectional view of a bottom electrode 400 of a trench capacitor for use in a CMOS image sensor, in accordance with another embodiment of the invention. Bottom electrode 400 is also one possible implementation of the bottom electrode (i.e., doped portion 195) of trench capacitor 115 of FIG. 1. As can be seen from FIG. 4, bottom electrode has a plurality of ridges 405 and a plurality of trenches 410. The structure of bottom electrode 400 may be formed through the patterning of openings 180 in mask 170 of FIGS. 2A and 2B.

Figure 5:
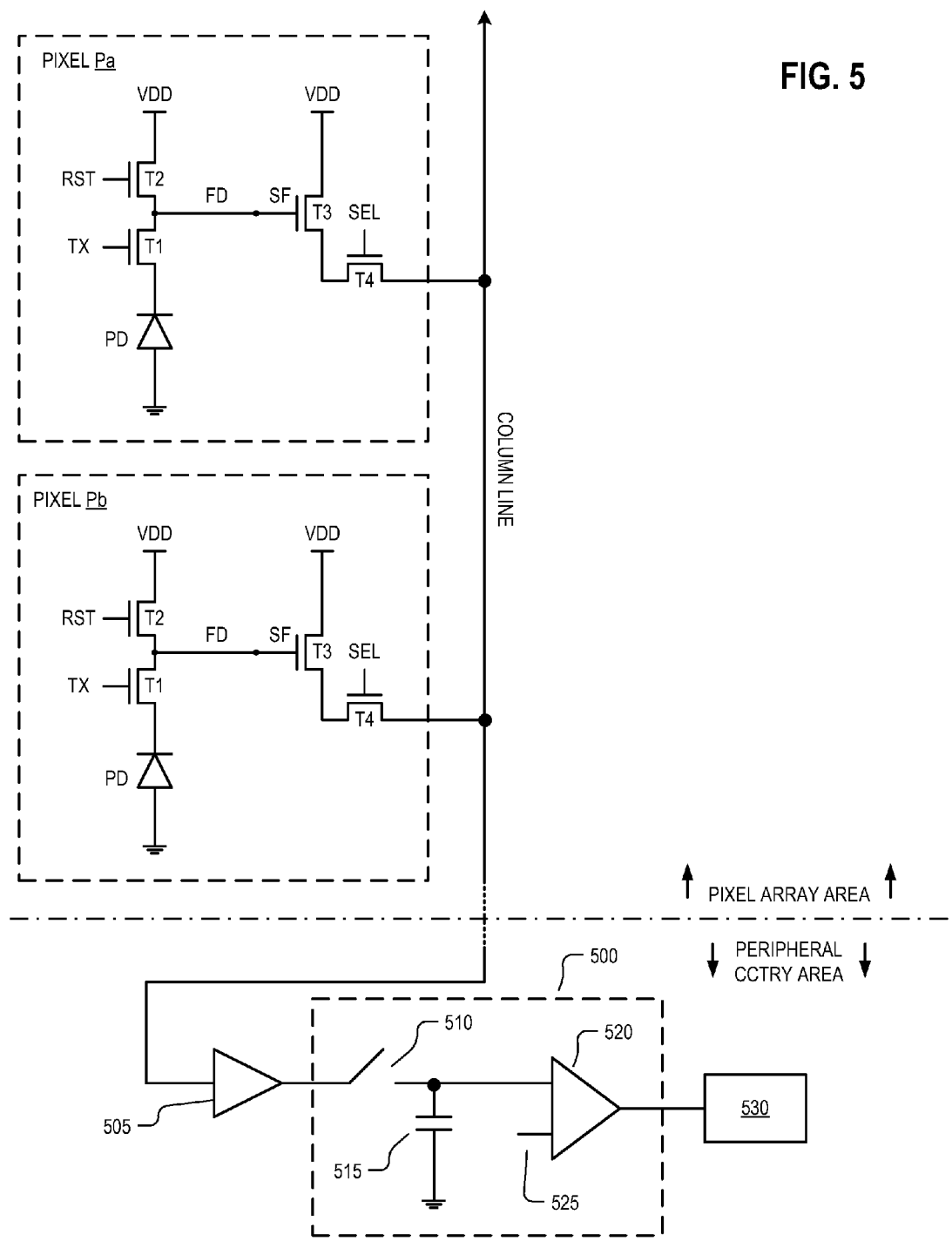
FIG. 5 is a circuit diagram illustrating an embodiment of two four-transistor ("4T") pixels within a pixel array area and sampling circuitry within a peripheral circuitry area of a CMOS image sensor, in accordance with an embodiment of the invention.

FIG. 5 is a circuit diagram illustrating an embodiment of two four-transistor ("4T") pixels within a pixel array area and sampling circuitry 500 within a peripheral circuitry area of a CMOS image sensor, in accordance with an embodiment of the invention. However, it should be appreciated that embodiments of the present invention are not limited to 4T pixel architectures; rather, one of ordinary skill in the art having the benefit of the instant disclosure will understand that the present teachings are also applicable to 3T designs, 5T designs, and various other pixel architectures. In FIG. 2, pixels Pa and Pb are arranged in two rows and one column. The illustrated embodiment of each pixel includes a photodiode PD, a transfer transistor T1, a reset transistor T2, a source-follower ("SF") transistor T3 and a select transistor T4. During operation, transfer transistor T1 receives a transfer signal TX, which transfers the charge accumulated in photodiode PD to a floating diffusion node FD. In one embodiment, floating diffusion node FD may be coupled to a storage capacitor (not shown) for temporarily storing image charges. Reset transistor T2 is coupled between a power rail VDD and the floating diffusion node FD to reset (e.g., discharge or charge the FD to a preset voltage) under control of a reset signal RST. The floating diffusion node FD is coupled to control the gate of SF transistor T3. SF transistor T3 is coupled between the power rail VDD and select transistor T4. SF transistor T3 operates as a source-follower providing a high impedance output from the pixel. Finally, select transistor T4 selectively couples the output of pixel circuitry to the column line under control of a select signal SEL.

As described above, after each pixel has acquired its image data or image charge, the image data is readout from the floating diffusion node FD by readout circuitry included in the peripheral circuitry area. In the illustrated embodiment, the readout circuitry includes a column amplifier 505 and sampling circuitry 500. As shown in FIG. 5, sampling circuitry 500 includes a switch 510, a sampling capacitor 515 and an analog-to-digital converter 520. Sampling capacitor 515 may be implemented with any of the aforementioned trench capacitors including trench capacitor 115, in accordance with the teachings of the present disclosure. However, because of the reduced area required for the formation of trench capacitor 115, additional circuitry may be included in the semiconductor die for additional functionality and/or the size of the die itself may be reduced for a smaller imaging sensor. Although FIG. 5 illustrates using trench capacitor 115 as sampling capacitor 515 of sampling circuitry 500, trench capacitor 115 and the processes described herein may also be appropriate for any large-value capacitor designed in the peripheral circuitry area. For example, trench capacitor 115 may be a coupling capacitor used for input/output functions in the peripheral circuitry area of image sensor 100.

Referring now back to the operation of sampling circuitry 500 in FIG. 5, switch 510 is controlled to selectively couple the sampling capacitor to the output of column amplifier 505 to sample the amplified image data that is provided by column amplifier 505. The sampled image data is then compared to a reference value 525 to produce a digitized output with analog-to-digital converter 520.

Sampling circuitry 500 then transfers this digitized image data to function logic 530, also included in peripheral circuitry area, for the storage or even the manipulation of the digitized image data by applying post image effects (e.g., crop, rotate, remove red eye, adjust brightness, adjust contrast, or otherwise).

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A complementary metal oxide semiconductor (CMOS) image sensor, comprising:
   an epitaxial layer;
   an array of pixels formed on a front side of the epitaxial layer in an pixel array area of the image sensor, wherein the array of pixels includes one or more shallow trench isolation structures disposed between adjacent pixels for isolating the pixels in the pixel array area; and
   a trench capacitor formed on the front side of the epitaxial layer in a peripheral circuitry area of the image sensor.

2. The CMOS image sensor of claim 1, wherein the trench capacitor includes a plurality of trenches.

3. The CMOS image sensor of claim 2, wherein a bottom electrode of the trench capacitor has a waffle structure having a plurality of posts.

4. The CMOS image sensor of claim 1, wherein a trench of the trench capacitor has a height and a width that is substantially equal to a height and width, respectively, of the one or more shallow trench isolation structures.

5. The CMOS image sensor of claim 1, wherein the trench capacitor is a sampling capacitor of a sampling circuit included in the peripheral circuitry area of the image sensor.

6. The CMOS image sensor of claim 1, wherein the trench capacitor is a coupling capacitor used for input/output functions in the peripheral circuitry area of the image sensor.

7. The CMOS image sensor of claim 1, wherein the trench capacitor further comprises a doped portion of the epitaxial layer in the peripheral circuitry area to serve as a first electrode of the trench capacitor, an oxide disposed in a trench of the trench capacitor to serve as a dielectric, and a polysilicon layer disposed on the oxide to serve as a second electrode of the trench capacitor.

8. The CMOS image sensor of claim 7, wherein at least one pixel in the array of pixels includes a gate oxide disposed on the epitaxial layer to isolate a transistor gate from the front side of the epitaxial layer, wherein the gate oxide is formed from same oxide as is the oxide disposed in the trench of the trench capacitor.

* * * * *